(12) United States Patent
Rasek et al.

(10) Patent No.: US 12,538,465 B2
(45) Date of Patent: Jan. 27, 2026

(54) INVERTER DEVICE, DRIVE DEVICE FOR AN ELECTRICALLY DRIVABLE VEHICLE, AND VEHICLE

(71) Applicant: Valeo Siemens eAutomotive Germany GmbH, Erlangen (DE)

(72) Inventors: Guido Rasek, Forchheim (DE); Alexandros Kourgialis, Fürth (DE)

(73) Assignee: Valeo Siemens eAutomotive Germany GmbH, Erlangen (DE)

( * ) Notice: Subject to any disclaimer, the term of this patent is extended or adjusted under 35 U.S.C. 154(b) by 856 days.

(21) Appl. No.: 17/783,515

(22) PCT Filed: Dec. 3, 2020

(86) PCT No.: PCT/EP2020/084362
§ 371 (c)(1),
(2) Date: Jun. 8, 2022

(87) PCT Pub. No.: WO2021/115896
PCT Pub. Date: Jun. 17, 2021

(65) Prior Publication Data
US 2023/0010775 A1   Jan. 12, 2023

(30) Foreign Application Priority Data
Dec. 11, 2019 (DE) .................. 10 2019 133 958.8

(51) Int. Cl.
*H05K 9/00* (2006.01)
*H05K 7/14* (2006.01)

(52) U.S. Cl.
CPC ....... *H05K 9/0026* (2013.01); *H05K 7/14322* (2022.08); *H05K 9/0022* (2013.01)

(58) Field of Classification Search
CPC . H05K 7/14322; H05K 9/0022; H05K 9/0026
See application file for complete search history.

(56) References Cited

U.S. PATENT DOCUMENTS

| 5,006,667 A | 4/1991 | Lonka |
| 8,863,869 B2 * | 10/2014 | Nakatsu ............. H05K 7/14322 361/689 |

FOREIGN PATENT DOCUMENTS

| CN | 1206199 C | 6/2005 |
| CN | 101026950 A | 8/2007 |

(Continued)

OTHER PUBLICATIONS

Office Action issued in counterpart Chinese Patent Application No. 202080086366.9 maield Dec. 28, 2024 (14 pages).

(Continued)

*Primary Examiner* — James Wu
(74) *Attorney, Agent, or Firm* — Osha Bergman Watanabe & Burton LLP

(57) ABSTRACT

An inverter device (1), comprising
a first printed circuit board (2) on which a transformer (3) is arranged;
a second printed circuit board (4) which is arranged parallel to the first printed circuit board (2) at a distance from the sides of the transformer (3); and
a cover element (5) which is arranged between the printed circuit boards (2, 4) for the purpose of electromagnetic shielding and has a through opening (6) through which the transformer (3) passes;
wherein the cover element (5) comprises a shielding unit (7) which surrounds the through opening (6) peripherally at least in some places and extends in the direction of the second printed circuit board (4).

12 Claims, 5 Drawing Sheets

(56) References Cited

FOREIGN PATENT DOCUMENTS

| CN | 107087341 A | 8/2017 | | |
|----|----|----|----|----|
| CN | 207560648 U | 6/2018 | | |
| DE | 102006028926 A1 | 12/2007 | | |
| DE | 102016213049 A1 | 1/2018 | | |
| EP | 1937040 A2 | 6/2008 | | |
| EP | 3439160 A1 | 2/2019 | | |
| JP | H07-302990 A | 11/1995 | | |
| JP | 200767279 A | 3/2007 | | |
| JP | 2009-124610 A | 6/2009 | | |
| WO | WO-2007029355 A1 * | 3/2007 | ............. | H05K 1/144 |
| WO | 2014044066 A1 | 3/2014 | | |

OTHER PUBLICATIONS

International Search Report and Written Opinion in corresponding in International Application No. PCT/EP2020/084362, dated Feb. 24, 2021 (16 pages).
German Search Report in corresponding German Application No. 10 2019 133 958.8, dated Nov. 17, 2020 (3 pages).

* cited by examiner

INVERTER DEVICE, DRIVE DEVICE FOR AN ELECTRICALLY DRIVABLE VEHICLE, AND VEHICLE

The present invention relates to an inverter device comprising a first printed circuit board on which a transformer is arranged; a second printed circuit board which is arranged parallel to the first printed circuit board at a distance from the sides of the transformer; a cover element which is arranged between the printed circuit boards for the purpose of electromagnetic shielding and has a through opening through which the transformer passes.

In addition, the invention relates to a drive device for an electrically drivable vehicle and to a vehicle.

The document EP 3,439,160 A1 discloses such an inverter device which discloses a power conversion device with a power module having a power semiconductor element, a driver printed circuit board for operating the power semiconductor element, a control printed circuit board with a control circuit for activating the power semiconductor element, and a metal base plate which is arranged between the driver printed circuit board and the control printed circuit board. The driver printed circuit board has a power transformer for transmitting driver power to the driver circuit. The base plate has a through opening in which a part of the power transformer is arranged.

In the case of an inverter device of this type, the cover element serves to protect the second printed circuit board from electromagnetic irradiation by the first printed circuit board. For reasons of space, a transformer is here passed through the cover element because the latter is typically that component of the first printed circuit board which extends furthest in the direction of the second printed circuit board.

The object of the invention is to provide an inverter device which is improved in particular in terms of electromagnetic compatibility, compared therewith.

In order to achieve this object, it is provided according to the invention in the case of an inverter device that the cover element comprises a shielding unit which surrounds the through opening at least in some places peripherally and extends in the direction of the second printed circuit board.

The invention is based on the idea of magnetic fields which pass through the through opening from the first printed circuit board being vertically compressed by the shielding unit which extends vertically, i.e. in a direction from the first printed circuit board to the second printed circuit board. In a similar fashion, this also applies to electrical fields which, because of the shielding unit, are likewise less interconnected in the direction of the second printed circuit board. Lower values for the field strength can consequently be achieved in a region between the cover element and the second printed circuit board. Partial enclosing of sections of the transformer which are situated above the cover element changes the field distribution by virtue of boundary conditions which need to be maintained such that the field distribution is shifted very considerably into a region between the first printed circuit board and the cover element which is typically less electromagnetically sensitive than the second printed circuit board. A considerable improvement in the electromagnetic compatibility is thus advantageously obtained by the inverter device according to the invention.

The cover element typically has a plate-like body. The shielding unit can be designed as integral with and/or with identical materials to the body of the cover element. It is alternatively also possible that the shielding unit is fastened on the body. The shielding unit can be formed, for example, by one or more pieces of sheet metal.

As already mentioned, it is in principle sufficient if the shielding unit surrounds the through opening at least in some places. The shielding unit can then, for example, have a plurality of interruptions peripherally. It is in principle preferred if at least 30%, particularly preferably at least 50%, very particularly preferably at least 75%, of the through opening is surrounded by the shielding unit.

However, in a preferred embodiment, it is provided that the shielding unit completely surrounds the through opening peripherally. A significantly greater improvement in the electromagnetic compatibility can thus be achieved. Such a shielding unit can be referred to figuratively as an EMC chimney.

In the case of the inverter device according to the invention, it is moreover advantageous if the shielding unit extends further in the direction of the second printed circuit board than the transformer.

In an advantageous development of the inverter device according to the invention, it can be provided that an electrically conductive surface layer is arranged on a side, facing the first printed circuit board, of the second printed circuit board at least in a region situated opposite the through opening. As a result, the vertical shielding effect can also be continued spatially in a plane which extends perpendicularly to the vertical. The surface layer is typically formed from copper. In particular, the surface layer spans the through opening.

In the case of the inverter device according to the invention, it can moreover be provided that the second printed circuit board bears on the shielding unit and/or contacts the shielding unit electrically conductively. In a particularly preferred embodiment, the shielding unit contacts the surface layer.

In a development of the inverter device according to the invention, it can be provided that it moreover comprises a casing enclosing the first printed circuit board, the second printed circuit board, and the cover element.

It is preferred here if the cover element bears on the casing and/or contacts the casing electrically conductively. For this purpose, it can be provided that a casing wall has a projection which serves as a bearing and/or contact surface for the cover element.

In an expedient embodiment of the inverter device according to the invention, it is provided that one or more further transformers are provided on the first printed circuit board, wherein a shielding unit is provided for each transformer. All of the statements regarding the shielding unit for the first transformer can also be carried over to the further transformers.

It is preferred here if the further transformer or at least one of the further transformers is gripped in some places by an outer concave edge of the cover element, and the shielding unit for the further transformer extends along the edge. The edge preferably delimits a recess of the cover element. With regard to the implementation of a further surface layer for the further transformer, it can be provided that the further surface layer spans the recess.

In a development, it can be provided that a casing wall extends along sections of the transformer which are not gripped by the edge. The typically vertically extending casing wall can thus be used to spatially supplement the shielding unit at no additional cost. The casing wall is generally part of the abovementioned casing.

The or each transformer is typically part of a driver device of the inverter device according to the invention. In particular semiconductor power circuit elements of the inverter device are arranged on the first printed circuit board. Components of a control device of the inverter device are expediently arranged on the second printed circuit board. The driver device serves typically to amplify signals of the control device which activate the semiconductor circuit elements.

The object on which the invention is based is moreover achieved by a drive device for an electrically drivable vehicle, comprising an electrical machine configured to drive the vehicle, and an inverter device according to the invention, wherein the inverter device is configured to supply alternating current to the electrical machine.

The object on which the invention is based is also achieved by a vehicle, comprising a drive device according to the invention.

Further advantages and details of the present invention emerge from the exemplary embodiments described below and on the basis of the drawings. These are schematic illustrations in which:

FIG. 1 shows a detailed view in section of an exemplary embodiment of an inverter device 1.

Figure 1:
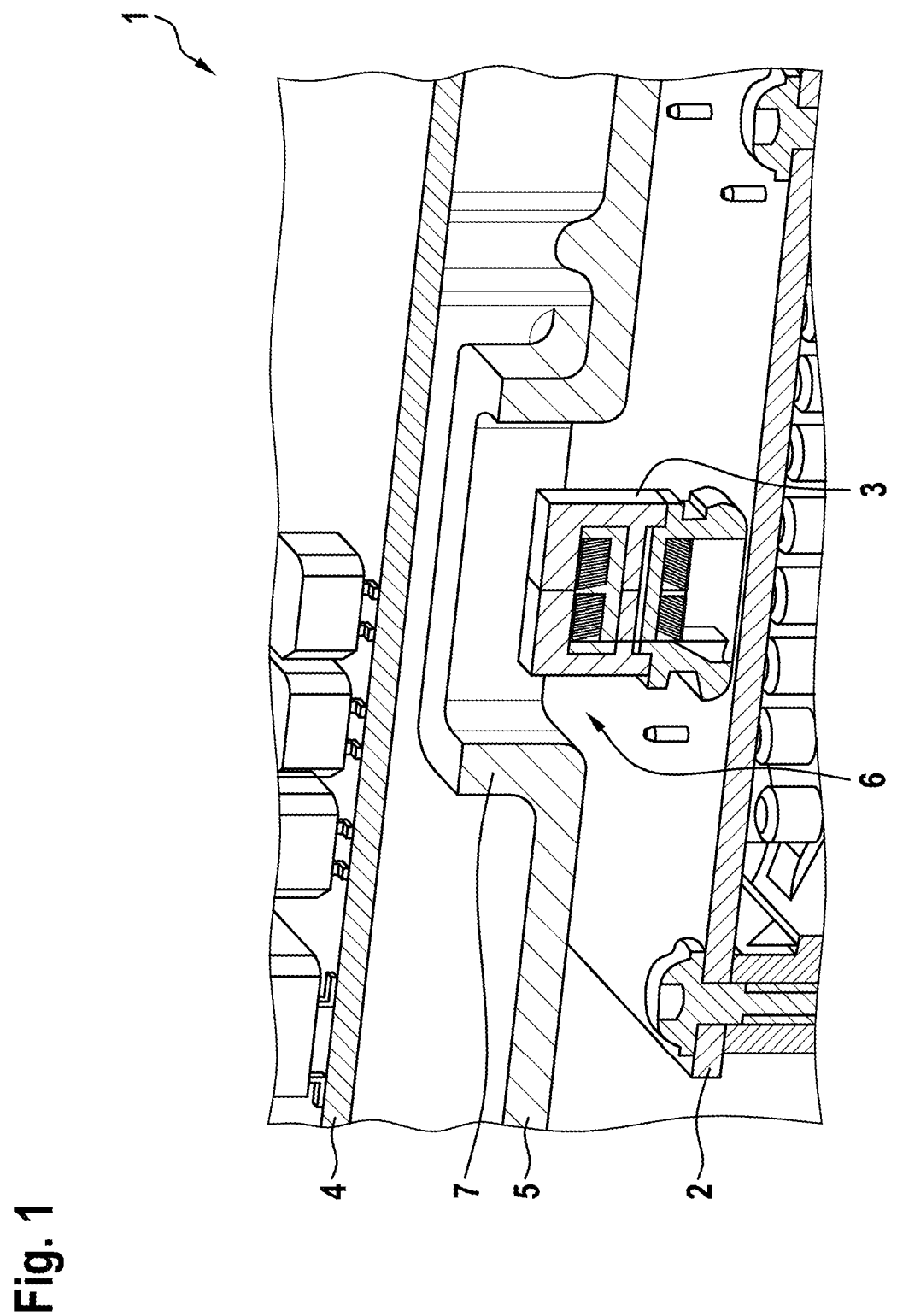
FIG. 1 shows a detailed view in section of an exemplary embodiment of the inverter device according to the invention.

The inverter device 1 comprises a first printed circuit board 2 on which a transformer 3 is arranged, a second printed circuit board 4 which is arranged parallel to the first printed circuit board 2 at a distance from sides of the transformer 3, and a cover element 5 which is arranged between the printed circuit boards 2, 4 for the purpose of electromagnetic shielding. The cover element 5 has a through opening 6 through which the transformer 3 passes. The cover element 5 additionally comprises a shielding unit 7 which surrounds the through opening 6 completely peripherally and extends in the direction of the second printed circuit board 4. It can be seen that the shielding unit 7 extends further than the transformer 3 in the direction of the second printed circuit board 4.

A driver device of the inverter device 1 is arranged on the first printed circuit board 2, wherein the transformer 3 is part of this driver device. Semiconductor power circuit elements (not shown) of the inverter device are arranged next to it on the first printed circuit board 2. In contrast, components of a control device of the inverter device 1 are arranged on the second printed circuit board 4. These are typically significantly more sensitive with respect to electromagnetic irradiation than the driver device and other components arranged on the first printed circuit board 2. The cover element 5 therefore in principle serves to electromagnetically shield the second printed circuit board 4 from the first printed circuit board 2.

Because the transformer 3 has a significantly greater structural height than other components provided on the first printed circuit board 2, the through opening 6 is provided. A magnetic field which is propagated through the through opening 6 is here considerably compressed by the shielding unit 7 and essentially forced back into a region between the first printed circuit board 2 and the cover element 5. This effect also applies in a similar fashion to electrical fields.

Figure 2:
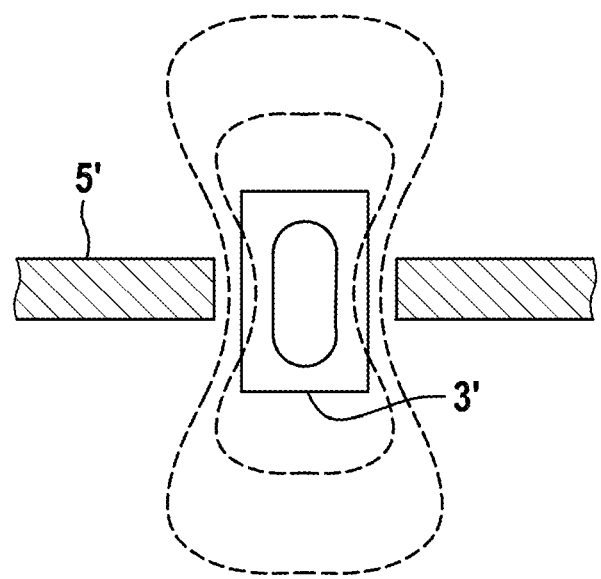
FIG. 2 shows a schematic diagram of a magnetic field distribution in the case of an inverter device according to the invention.
Figure 3:
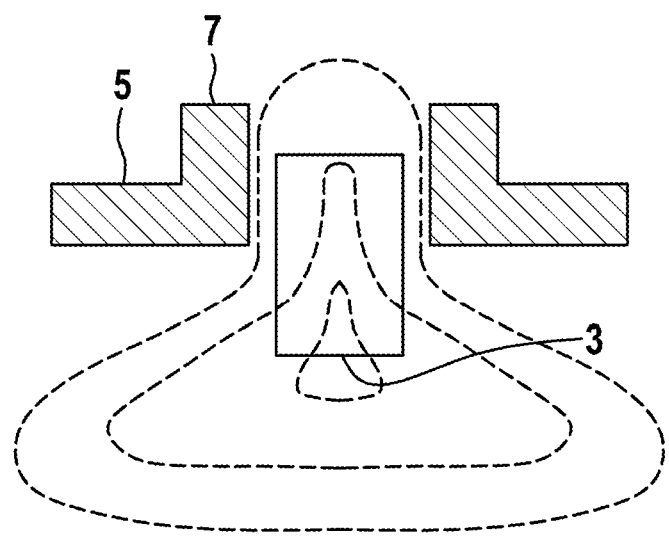
FIG. 3 shows a schematic diagram of a magnetic field distribution in the case of the inverter device according to the exemplary embodiment.

FIG. 2 and FIG. 3 show magnetic field distributions, wherein FIG. 2 relates to an inverter device according to the prior art with a transformer 3' and a cover element 5' with no shielding unit, and FIG. 3 relates to the inverter device 1 according to the exemplary embodiment.

It can be seen, in the case of the (purely qualitatively illustrated) magnetic field distributions, that the boundary conditions defined by the shielding unit 7 result in a significant shifting of the field distribution into the region between the first printed circuit board 2 and the cover element 5 which is less electromagnetically sensitive than the region between the cover element 5 and the second printed circuit board 4.

Figure 4:
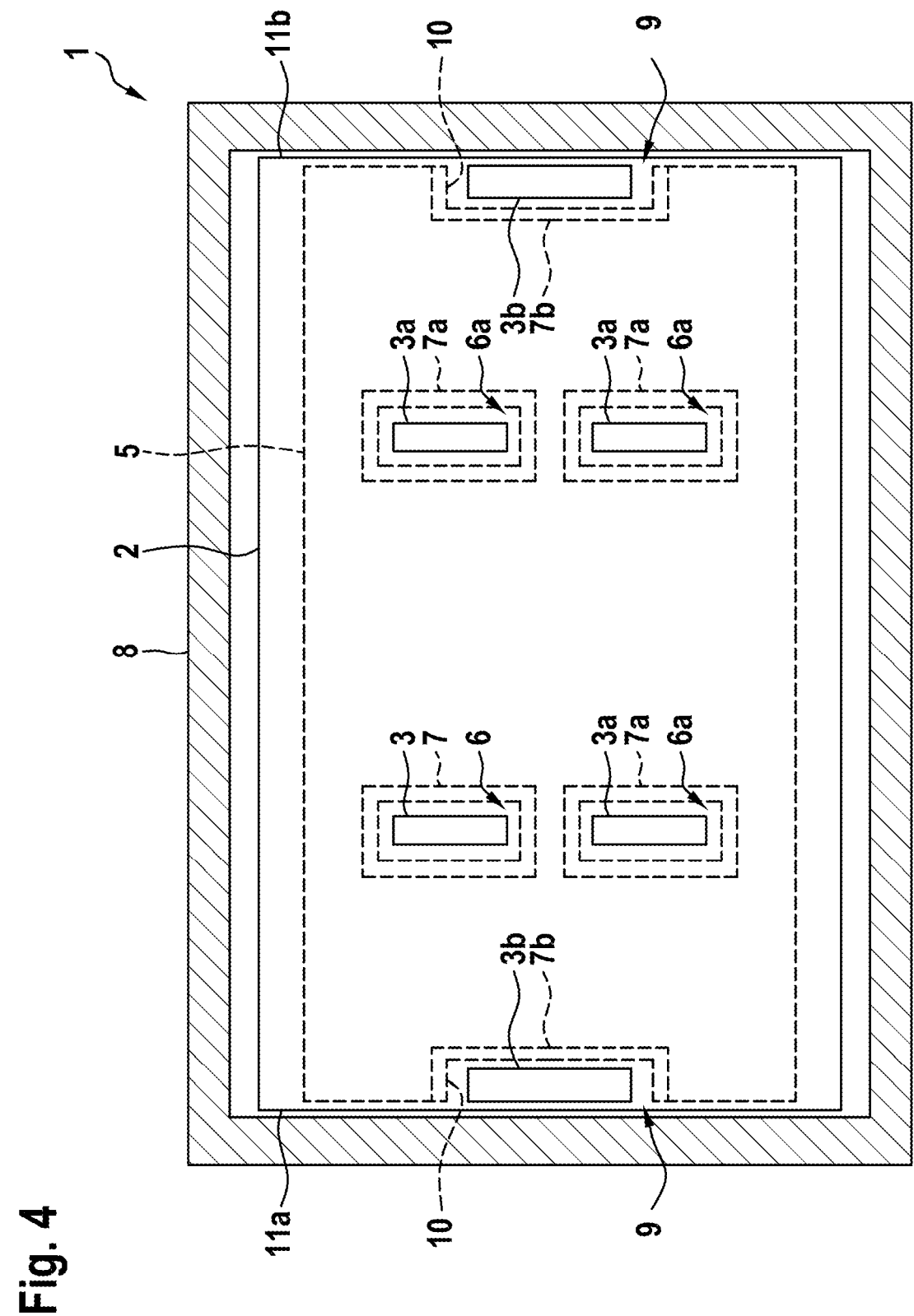
FIG. 4 shows a schematic diagram of a plan view of the first printed circuit board of the inverter device according to the exemplary embodiment.

FIG. 4 shows a schematic diagram of a plan view of the first printed circuit board 2 of the inverter device 1 according to the exemplary embodiment.

A further through opening 6a and a shielding unit 7a are provided in each case for the further transformers 3a in the same way as for the transformer 3 in the cover element 5. The cover element 5 has recesses 9 for the further transformers 3b arranged on the edge of the first printed circuit board 2. The further transformers 3b are here each gripped in some places by a concave edge 10 of the cover element 5. A further shielding unit 7b, which extends along the edge 10, is in each case provided for the further transformers 3b. A casing wall 11a, 11b of the casing 8 here extends in each case along those sections of the further transformers 3b which are not gripped by the edge 10.

Figure 5:
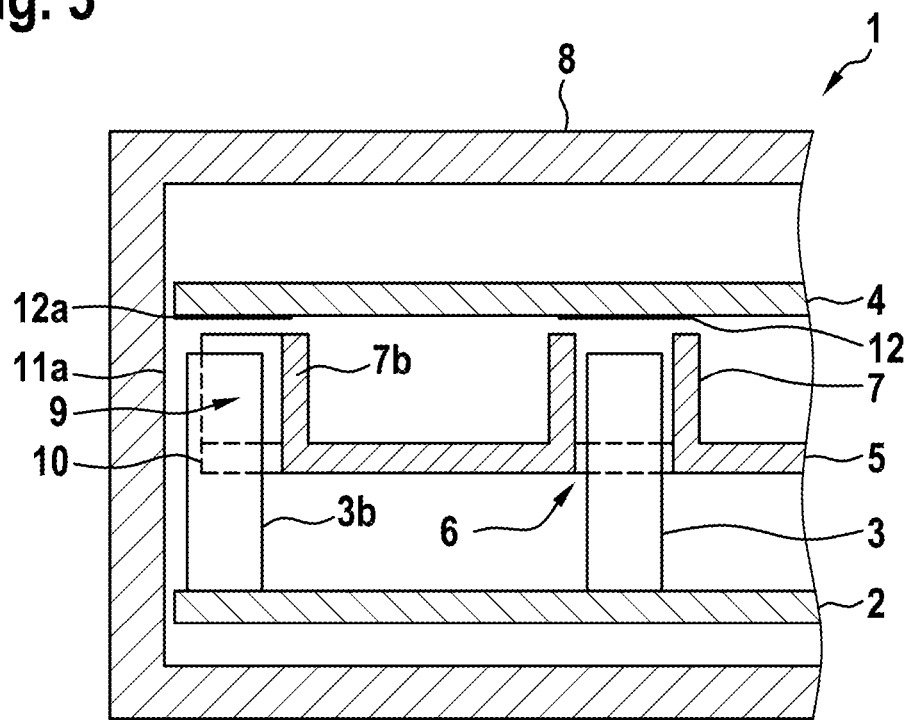
FIG. 5 shows a schematic diagram of a detailed view in section of the inverter device according to the exemplary embodiment.

FIG. 5 is a schematic diagram of a detailed view in section of the inverter device 1 according to the exemplary embodiment.

It can be seen here that the casing wall 11a, together with the further shielding element 7b, forms almost completely peripheral shielding around the further transformer 3b such that a similar shielding effect is obtained as that by the shielding unit 7 for the transformer 3.

in addition, FIG. 5 shows a surface layer 12, formed from copper, which is formed on that side of the second printed circuit board 4 which faces the first printed circuit board 2 and extends in a region situated opposite the through opening 6 and spans the latter. The surface layer 12 ensures that the shielding action of the shielding unit 7 is expanded spatially.

Corresponding surface layers 12 are also provided for the further transformers 3a. For the further transformers 7b, a surface layer 12a is in each case formed on that side of the second printed circuit board 4 which faces the first printed circuit board. The surface layer 12a spans the recess 9. All the abovementioned surface layers 12, 12a are formed from copper or from a different metal.

Figure 6:
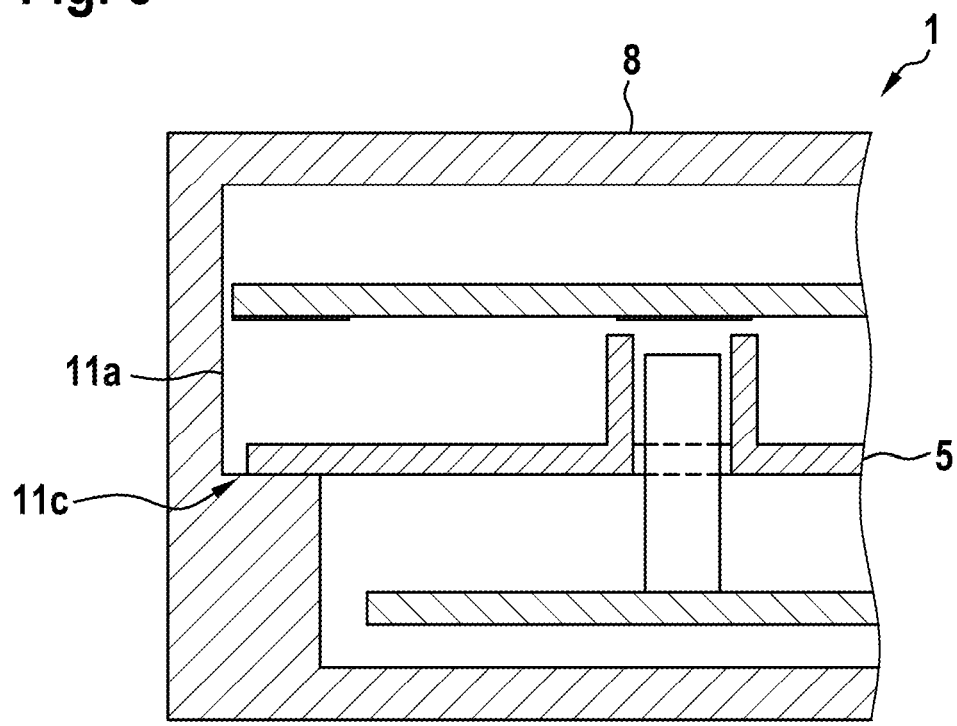
FIG. 6 shows a schematic diagram of a detailed view in section of a second exemplary embodiment of the inverter device according to the invention.

FIG. 6 is a detailed view in section of a second exemplary embodiment of an inverter device 1. Apart from the differences described below, this corresponds to the first exemplary embodiment, wherein the same components or components which have the same effect are provided with identical reference numerals.

In the second exemplary embodiment, the cover element 5 bears on the casing 8 and is contacted electrically conductively to the latter. To do this, the casing walls 11a, 11b, only the casing wall 11a of which is shown in FIG. 6, have a step-like projection 11c which points toward the inside of the casing and forms a bearing and contact surface for the cover element 5.

Figure 7:
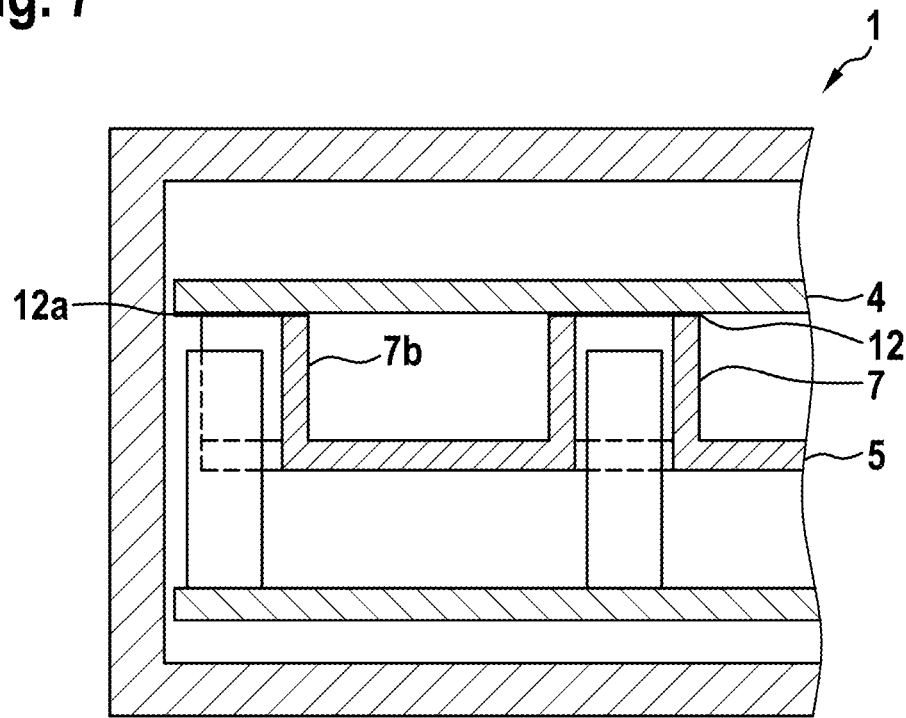
FIG. 7 shows a schematic diagram of a detailed view in section of a third exemplary embodiment of the inverter device according to the invention.

FIG. 7 is a detailed view in section of a third exemplary embodiment of an inverter device 1. Apart from the differences described below, this corresponds to one of the above described exemplary embodiments, wherein the same components or components which have the same effect are provided with identical reference numerals.

In the third exemplary embodiment, a respective surface layer 12, 12a of the second printed circuit board 4 bears on the shielding unit 7, 7a, 7b spanned by it and contacts the shielding unit 7, 7a, 7b electrically conductively. For reasons of clarity, only the shielding units 7, 7b are shown here in FIG. 7.

According to a further exemplary embodiment of an inverter device 1 which otherwise corresponds to one of the above described exemplary embodiments, some or all of the shielding units 7, 7a, 7b are interrupted peripherally once or multiple times.

According to a further exemplary embodiment of an inverter device 1, the shielding units 7, 7a, 7b are not formed integrally with a plate-like body of the cover element 5 and instead by one or more pieces of sheet metal fastened to the body.

Figure 8:
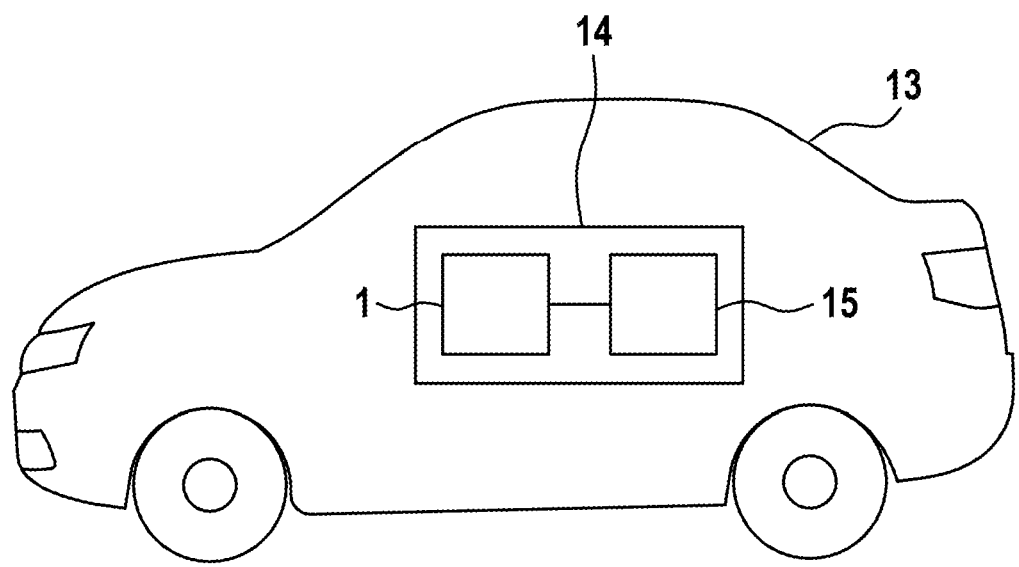
FIG. 8 shows a schematic diagram of an exemplary embodiment of the vehicle according to the invention with an exemplary embodiment of the drive device according to the invention.

FIG. 8 is a schematic diagram of an exemplary embodiment of a vehicle 13 with an exemplary embodiment of a drive device 14. The drive device 14 is configured to drive the vehicle 13 which is, for example, an electric vehicle (BEV) or a hybrid vehicle. The drive device 14 comprises an electrical machine 15 configured to drive the vehicle, and an inverter device 1 according to one of the above described exemplary embodiments, wherein the inverter device 1 is configured to supply (in this case, by way of example, three-phase) alternating voltage to the electrical machine.

The invention claimed is:

1. An inverter device comprising:
    a first printed circuit board on which a plurality of transformers are arranged;
    a second printed circuit board which is arranged parallel to the first printed circuit board at a distance from the sides of the plurality of transformers; and
    a cover element which is arranged between the first and second printed circuit boards for the purpose of electromagnetic shielding and has a plurality of through openings through which the transformers pass,
    wherein the cover element comprises a plurality of shielding units, each shielding unit surrounding a corresponding through opening of a plurality of through openings peripherally at least in some places and extending towards a direction of the second printed circuit board, and
    wherein the plurality of transformers comprises a first transformer and a second transformer, where the first transformer is arranged on an outer edge of the first printed circuit board,
    wherein the plurality of shielding units comprises a first shielding unit and a second shielding unit, where the first shielding unit shields the first transformer from electromagnetic irradiation and the second shielding unit shields the second transformer from the electromagnetic irradiation, and
    wherein the first shielding unit partially surrounds the corresponding through opening for the first transformer and the second shielding unit completely surrounds the corresponding through opening for the second transformer.

2. The inverter device as claimed in claim 1, wherein the plurality of shielding units extends further than the plurality of transformers in the direction of the second printed circuit board.

3. The inverter device as claimed in claim 1, wherein an electrically conductive surface layer is arranged on a side, facing the first printed circuit board, of the second printed circuit board at least in a region situated opposite the through opening.

4. The inverter device as claimed in claim 1, wherein the second printed circuit board bears on the plurality of shielding units and/or contacts the plurality of shielding units electrically conductively.

5. The inverter device as claimed in claim 1, comprising: a casing enclosing the first printed circuit board, the second printed circuit board, and the cover element.

6. The inverter device as claimed in claim 5, wherein the cover element bears on the casing and/or contacts the casing electrically conductively.

7. The inverter device as claimed in claim 1, wherein the first transformer is arranged in a recess delimited by an outer concave edge of the cover element, and the first shielding unit for the first transformer extends along the outer concave edge.

8. The inverter device as claimed in claim 7, wherein a casing wall extends along sections of the first transformer which are not facing the outer concave edge.

9. The inverter device as claimed in claim 1, wherein the plurality of transformers is part of a drive device of the inverter device.

10. The inverter device as claimed in claim 1, wherein semiconductor power circuit elements of the inverter device are arranged on the first printed circuit board and/or components of a control device of the inverter device are arranged on the second printed circuit board.

11. A drive device for an electrically drivable vehicle, comprising:
    an electrical machine configured to drive the electrically drivable vehicle; and
    the inverter device as claimed in claim 1,
    wherein the inverter device is configured to supply alternating current to the electrical machine.

12. The electrically drivable vehicle, comprising: the drive device as claimed in claim 11.

* * * * *